(12) United States Patent
Sohn et al.

(10) Patent No.: US 8,450,618 B2
(45) Date of Patent: May 28, 2013

(54) PRINTED CIRCUIT BOARD WITH REINFORCED THERMOPLASTIC RESIN LAYER

(75) Inventors: Keung-Jin Sohn, Suwon-si (KR);
Joon-Sik Shin, Suwon-si (KR);
Joung-Gul Ryu, Seoul (KR);
Jung-Hwan Park, Seongnam-si (KR);
Ho-Sik Park, Hwaseong-si (KR);
Sang-Youp Lee, Seoul (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 0 days.

(21) Appl. No.: 13/137,656

(22) Filed: Aug. 31, 2011

(65) Prior Publication Data
US 2011/0315437 A1 Dec. 29, 2011

Related U.S. Application Data

(62) Division of application No. 12/232,894, filed on Sep. 25, 2008.

(30) Foreign Application Priority Data

Apr. 14, 2008 (KR) .................. 10-2008-0034145

(51) Int. Cl.
*H05K 1/03* (2006.01)
*H05K 1/09* (2006.01)

(52) U.S. Cl.
USPC .......................................... 174/256; 174/250

(58) Field of Classification Search
USPC .......... 174/250, 255–257, 258, 259; 428/209, 428/901, 137; 29/830, 746, 847
See application file for complete search history.

(56) References Cited

U.S. PATENT DOCUMENTS

| 6,500,535 B1 * | 12/2002 | Yamada et al. | 428/327 |
| 7,820,274 B2 * | 10/2010 | Ohta et al. | 428/209 |
| 2006/0257622 A1 * | 11/2006 | Shin et al. | 428/137 |

FOREIGN PATENT DOCUMENTS

| JP | 2006-319324 | 11/2006 |
| JP | 2007-320088 | 12/2007 |

OTHER PUBLICATIONS

Office Action mailed from the U.S. Patent and Trademark Office on Apr. 3, 2012 in the related U.S. Appl. No. 12/232,894.
U.S. Patent Restriction Requirement, mailed May 19, 2011, issued in corresponding U.S. Appl. No. 12/232,894.
U.S. Appl. No. 12/232,894, filed Sep. 25, 2008, Keung-Jin Sohn et al., Samsung Electro-Mechanics Co., Ltd.
U.S. Patent Office Action mailed Sep. 1, 2011 in U.S. Appl. No. 12/232,894.
Notice of Allowance mailed from the U.S. Patent and Trademark Office on Nov. 7, 2012 in the related U.S. Appl. No. 12/232,894.
Office Action mailed from the U.S. Patent and Trademark Office on Jul. 23, 2012 in the related U.S. Appl. No. 12/232,894.

* cited by examiner

*Primary Examiner* — Yuriy Semenenko

(57) ABSTRACT

A printed circuit board includes; a thermoplastic reinforcement material having fibers secured by a thermoplastic polymer binder and having pores formed therein; a thermoplastic resin layer having the thermoplastic reinforcement material impregnated with a thermoplastic resin; and a circuit pattern formed over the thermoplastic resin layer, wherein the thermoplastic reinforcement material and the thermoplastic resin layer have a thickness ratio (thickness of the thermoplastic reinforcement material÷thickness of the thermoplastic resin layer) of 0.9 or higher.

4 Claims, 8 Drawing Sheets

PRINTED CIRCUIT BOARD WITH REINFORCED THERMOPLASTIC RESIN LAYER

CROSS-REFERENCE TO RELATED APPLICATIONS

This application is a U.S. divisional application filed under 37 CFR 1.53(b) claiming priority benefit of U.S. Ser. No. 12/232,894 filed in the United States on Sep. 25, 2008, which claims earlier priority benefit to Korean Patent Application No. 10-2008-0034145 filed with the Korean Intellectual Property Office on Apr. 14, 2008, the disclosures of which are incorporated herein by reference.

BACKGROUND

1. Field

The present invention relates to a method of manufacturing an insulating sheet, a method of manufacturing a copper clad laminate, and a method of manufacturing a printed circuit board, as well as a printed circuit board manufactured using these methods.

2. Description of the Related Art

In step with the advanced level of development in high-tech industries, such as the electrical, electronic, and aerospace industries, the printed circuit board (PCB) used in electronic equipment is expected to provide high levels of performance. In order to provide a lighter weight, lower thickness, and smaller size, the printed circuit board is being provided with thinner substrates, higher-density circuits, and finer patterns, etc., especially in a package for a semiconductor memory or computation device. Also, passive components, such as capacitors, etc., and active components, such as IC chips, may be embedded in the substrate, while the package itself may have a 3-dimensional form, with chips arranged in a stack.

In a printed circuit board thus provided with a higher density, as well as lighter weight, lower thickness, and smaller size, however, defects present in existing printed circuit boards, such as bending deformations in the substrate and degraded solder joint reliability due to differences in coefficients of thermal expansion between the substrate and the mounted chips, etc., may be exacerbated.

In order to prevent interference between circuits even in high frequencies, a printed circuit board having a higher density, lighter weight, lower thickness, and smaller size may also be required to provide a low dielectric constant (Dk) and low dielectric loss (Df). To obtain such properties, improvements are needed in the materials used for the printed circuit board, such as the copper clad laminate (CCL) and the prepreg (PPG).

A multi-layer printed circuit board according to the related art may be made as a composite of thermosetting resin, glass fibers, and an inorganic filler. Epoxy resin and BT (bismaleimide triazine) resin may generally be used for the main resin.

The epoxy resin used in a printed circuit board may form a 3-dimensional structure, as the epoxy groups in the resin molecules react with hardening agents to form cross-links. The types of epoxy resin commonly used can be divided into the bisphenol types and novolac types according to the preparation method.

Due to the movement towards environment-friendly products in current electric and electronic equipment, there is a demand for lead-free and halogen-free solder. As such, epoxy having a high glass temperature ($T_g$) and epoxy that does not include a bromine based flame retardant have also been developed.

A filler such as silicon dioxide ($SiO_2$) may be added to an epoxy resin to complement the properties of the epoxy, while other fillers such as aluminum trihydrate (ATH) that serve as flame retardants may also be added. When using $SiO_2$ fillers, which generally have a relatively lower coefficient of thermal expansion (CTE), fillers having smaller sizes may be used, in order to increase the content and hence the effect of $SiO_2$, and fillers may be selected which have a greater effect of lowering the CTE.

In the case of glass fiber fabric used for the reinforcement material, E-glass may generally be used, while fabric made from high-strength glass fibers such as S-glass, NE-glass, T-glass, D-glass, etc., are also being used, in order to provide lower CTE.

A glass fiber fabric may be impregnated with a resin to produce a B-stage prepreg, while several layers of prepreg and copper foils may be stacked, heated, and compressed to produce a copper clad laminate.

In addition to epoxy resin, BT resin may often be used for the main resin in a printed circuit board intended for use in a package, because it may provide more desirable characteristics than does epoxy resin in terms of thermal properties (e.g. high $T_g$), electrical properties, and copper foil peel strength, etc., and because it is structurally very stable.

The thermal properties can be especially important, since the board for a package requires high reliability. That is, the coefficient of thermal expansion (CTE) may be different below and above the glass transition temperature ($T_g$) of the resin, and uneven contraction in volume during the manufacturing process may cause brittleness and warpage in the package board.

Furthermore, when uneven thermal expansion and contraction are repeated during the manufacturing process at around the glass transition temperature ($T_g$), residual stresses may be generated which may cause potential defects in the final product, such as delamination and warpage.

Existing materials used in manufacturing a package that display such properties may include BT or epoxy resin with a glass fiber fabric (e.g. E-glass type fabric), which has a low coefficient of thermal expansion but a high dielectric constant of about 6.2, so that the materials may have a relatively high dielectric constant of 3.5 to 4, as well as high dielectric loss. Thus, these materials may be difficult to use in high frequency regions (e.g. in the GHz range), and also, the fibers may not be readily impregnated by the resin.

Polyimide (PI), which may be used in a flexible copper clad laminate (FCCL), which is a material utilized in forming flexible and rigid-flexible PCB's, may have a rate of moisture absorption, and hence may entail dimensional instability, as well as a high dielectric constant (Dk) and high loss (Df).

SUMMARY

An aspect of the invention is to provide a method of manufacturing an insulating sheet, which has a low rate of moisture absorption and superb electrical properties, including a low dielectric constant (Dk) and low dielectric loss (Df), and in which the fibers can readily be impregnated with the resin. An aspect of the invention aims also to provide a method of manufacturing a copper clad laminate, a method of manufacturing a printed circuit board, and a printed circuit board manufactured using these methods.

One aspect of the invention provides a method of manufacturing an insulating sheet that includes: forming a thermoplastic reinforcement material, which includes fibers secured by a thermoplastic polymer binder, and in which pores are formed; forming a thermoplastic resin layer such that the thermoplastic reinforcement material is impregnated with a thermoplastic resin; and hot pressing the thermoplastic reinforcement material and the thermoplastic resin layer.

The thermoplastic reinforcement material can include a liquid crystal polymer non-woven fabric, while the thermoplastic resin layer can include a liquid crystal polymer resin.

The density of the thermoplastic reinforcement material may be 0.1 g/cm$^3$ or lower, while the coefficient of thermal expansion of the thermoplastic reinforcement material may be 10 ppm/° C. or lower.

The hot pressing operation can be performed at a temperature higher than a fusion point of the thermoplastic resin layer by 10 to 50° C. and lower than a fusion point of the thermoplastic reinforcement material by 10° C.

Another aspect of the invention provides a method of manufacturing a copper clad laminate that includes: forming a thermoplastic reinforcement material, which includes fibers secured by a thermoplastic polymer binder, and in which pores are formed; forming a thermoplastic resin layer such that the thermoplastic reinforcement material is impregnated with a thermoplastic resin; forming a metal layer over the thermoplastic resin layer; and hot pressing the thermoplastic reinforcement material and the metal layer.

The thermoplastic reinforcement material can include a liquid crystal polymer non-woven fabric, while the thermoplastic resin layer can include a liquid crystal polymer resin.

The density of the thermoplastic reinforcement material may be 0.1 g/cm$^3$ or lower, while the coefficient of thermal expansion of the thermoplastic reinforcement material may be 10 ppm/° C. or lower.

The hot pressing operation can be performed at a temperature higher than a fusion point of the thermoplastic resin layer by 10 to 50° C. and lower than a fusion point of the thermoplastic reinforcement material by 10° C.

Still another aspect of the invention provides a method of manufacturing a printed circuit board that includes: forming a thermoplastic reinforcement material, which includes fibers secured by a thermoplastic polymer binder, and in which pores are formed; forming a thermoplastic resin layer such that the thermoplastic reinforcement material is impregnated with a thermoplastic resin; forming a metal layer over the thermoplastic resin layer; hot pressing the thermoplastic reinforcement material and the metal layer; and forming a circuit pattern in the metal layer.

The thermoplastic reinforcement material can include a liquid crystal polymer non-woven fabric, while the thermoplastic resin layer can include a liquid crystal polymer resin.

The density of the thermoplastic reinforcement material may be 0.1 g/cm$^3$ or lower, while the coefficient of thermal expansion of the thermoplastic reinforcement material may be 10 ppm/° C. or lower.

The hot pressing operation can be performed at a temperature higher than a fusion point of the thermoplastic resin layer by 10 to 50° C. and lower than a fusion point of the thermoplastic reinforcement material by 10° C.

Yet another aspect of the invention provides a printed circuit board that includes: a thermoplastic reinforcement material, which includes fibers secured by a thermoplastic polymer binder, and in which pores are formed; a thermoplastic resin layer having the thermoplastic reinforcement material impregnated with a thermoplastic resin; and a circuit pattern formed over the thermoplastic resin layer. The thermoplastic reinforcement material and the thermoplastic resin layer can have a thickness ratio (thickness of the thermoplastic reinforcement material÷thickness of the thermoplastic resin layer) of 0.9 or higher.

The thermoplastic reinforcement material can include a liquid crystal polymer non-woven fabric, while the thermoplastic resin layer can include a liquid crystal polymer resin.

Also, the thermoplastic reinforcement material may have a density of 0.1 g/cm$^3$ or lower, while the thermoplastic reinforcement material may have a coefficient of thermal expansion of 10 ppm/° C. or lower.

Additional aspects and advantages of the present invention will be set forth in part in the description which follows, and in part will be obvious from the description, or may be learned by practice of the invention.

DESCRIPTION OF EMBODIMENTS

Figure 1:
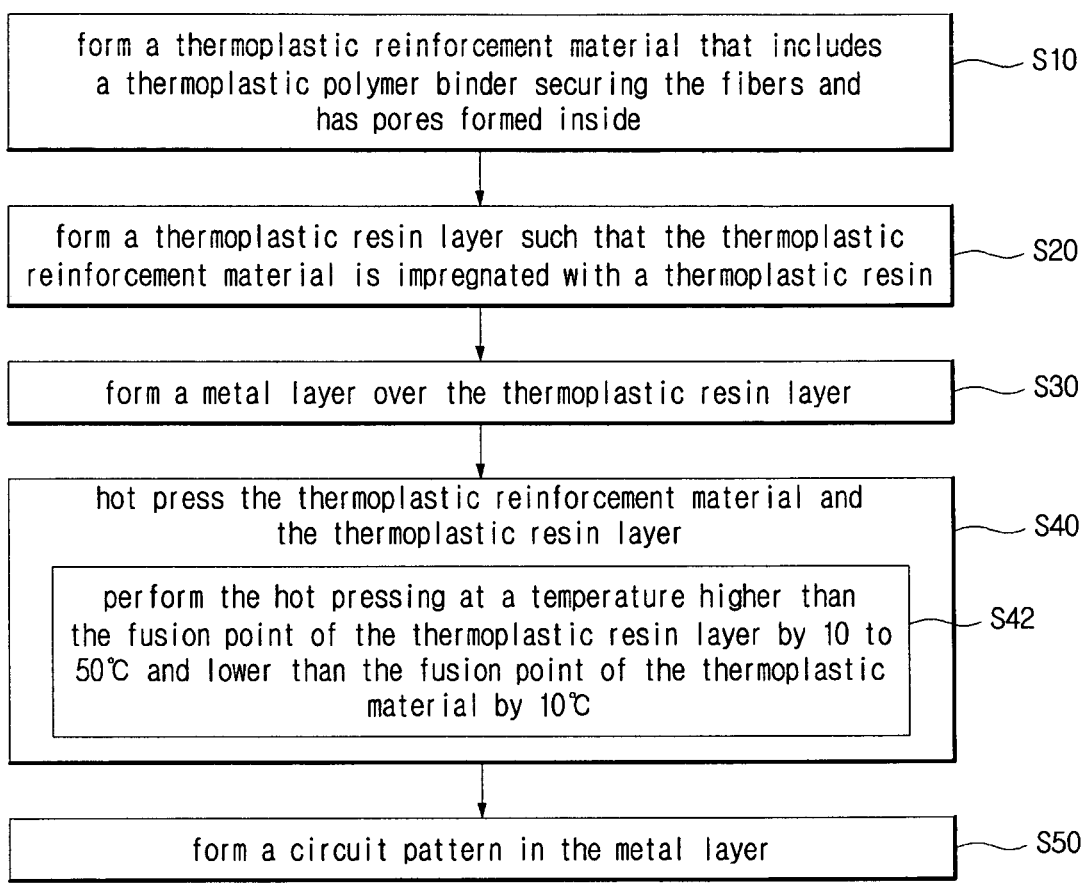
FIG. 1 is a flowchart illustrating a method of manufacturing a printed circuit board according to an embodiment of the invention.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of related art are omitted when it is deemed that they may unnecessarily obscure the essence of the invention.

The terms used in the present specification are merely used to describe particular embodiments, and are not intended to limit the present invention. An expression used in the singular encompasses the expression of the plural, unless it has a clearly different meaning in the context. In the present specification, it is to be understood that the terms such as "including" or "having," etc., are intended to indicate the existence of the features, numbers, steps, actions, elements, parts, or combinations thereof disclosed in the specification, and are not intended to preclude the possibility that one or more other features, numbers, steps, actions, elements, parts, or combinations thereof may exist or may be added.

The method of manufacturing an insulating sheet, method of manufacturing a copper clad laminate, and method of manufacturing a printed circuit board, as well as the printed circuit board manufactured using these methods, according to certain embodiments of the invention, will be described below in more detail with reference to the accompanying drawings. Those elements that are the same or are in correspondence are rendered the same reference numeral regardless of the figure number, and redundant explanations are omitted.

Figure 4:
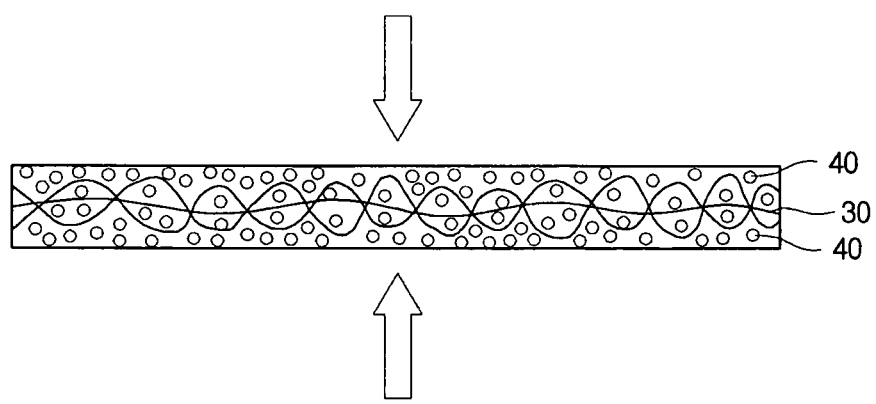
Figure 5:
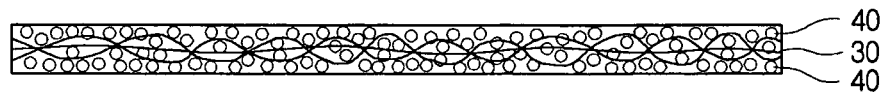
Figure 6:
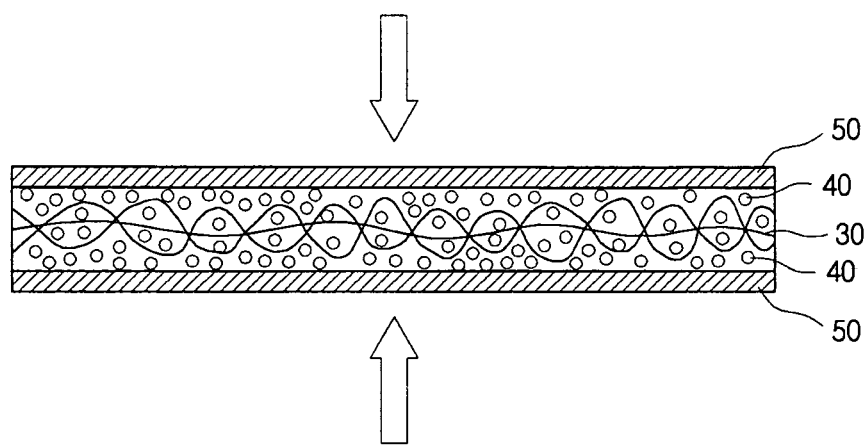
FIG. 6 and FIG. 7 are drawings representing a flow diagram for a method of manufacturing a copper clad laminate according to an embodiment of the invention.
Figure 7:
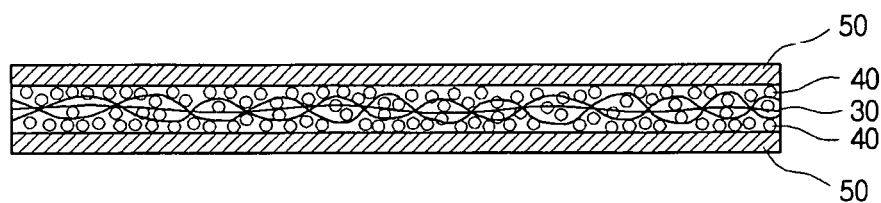
Figure 8:
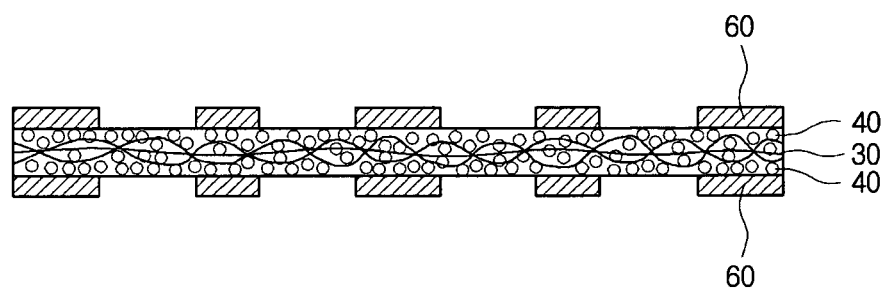
FIG. 8 is a cross sectional view of a printed circuit board according to an embodiment of the invention.

FIG. 1 is a flowchart illustrating a method of manufacturing a printed circuit board according to an embodiment of the invention, FIG. 2 through FIG. 5 are drawings representing a flow diagram for a method of manufacturing an insulating sheet according to an embodiment of the invention, FIG. 6 and FIG. 7 are drawings representing a flow diagram for a method of manufacturing a copper clad laminate according to an embodiment of the invention, and FIG. 8 is a cross sectional view of a printed circuit board according to an embodiment of the invention.

In FIG. 2 through FIG. 8, there are illustrated fibers 10, a thermoplastic polymer binder 20, a thermoplastic reinforcement material 30, a thermoplastic resin layer 40, a thermoplastic resin 42, metal layers 50, and circuit patterns 60.

A method based on this embodiment can include forming a thermoplastic reinforcement material, which includes fibers secured by a thermoplastic polymer binder, and in which pores are formed; forming a thermoplastic resin layer such that the thermoplastic reinforcement material is impregnated with a thermoplastic resin; and hot pressing the thermoplastic reinforcement material and the thermoplastic resin layer. This method can be utilized to radically improve the amount of thermoplastic resin with which the fibers are impregnated. The method can also be used to implement an insulating sheet, which has a low rate of moisture absorption and has a low dielectric constant (Dk) and low dielectric loss (Df) in high frequency regions, and implement a copper clad laminate and a printed circuit board using the insulating sheet.

Figure 2:
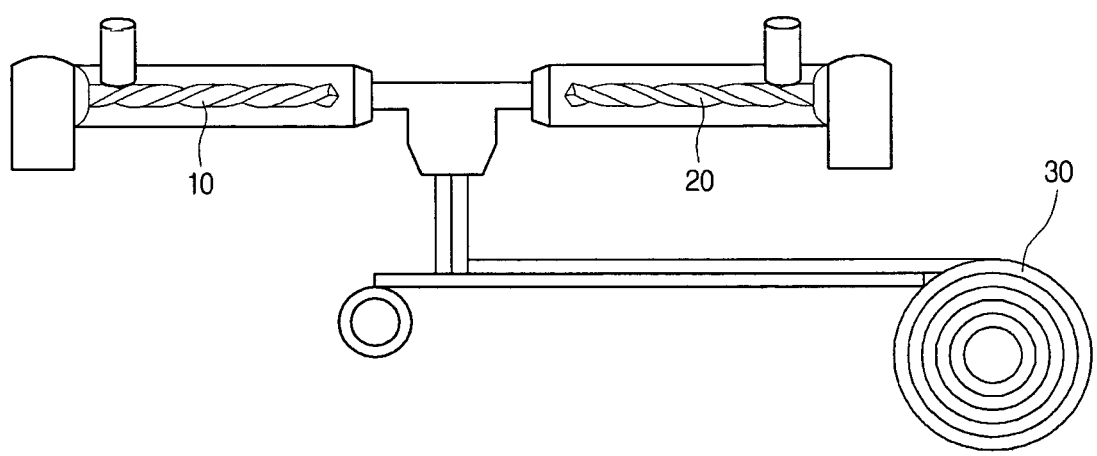
FIG. 2, FIG. 3, FIG. 4, and FIG. 5 are drawings representing a flow diagram for a method of manufacturing an insulating sheet according to an embodiment of the invention.

To this end, a thermoplastic reinforcement material 30 can first be formed (S10), in which fibers 10 are secured by a thermoplastic polymer binder 20, and in which pores are formed, as in the example illustrated in FIG. 2. This particular embodiment will be described using a liquid crystal polymer non-woven fabric as an example of the thermoplastic reinforcement material 30 and a liquid crystal polymer binder as an example of the thermoplastic polymer binder 20. Also, a liquid crystal polymer resin will be used as an example of a thermoplastic resin layer 40.

Liquid crystal polymers (LCP) are currently regarded as an alternative to polyimide (PI), used in a flexible copper clad laminate (FCCL), which is a material used in flexible and rigid-flexible PCB's.

One reason for this is that liquid crystal polymers can be used to overcome the disadvantages of polyimide, such as a high moisture absorption rate and the resultant dimensional instability and high dielectric constant (Dk) and loss (Df). Liquid crystal polymers also provide superb electrical properties, as they provide a low dielectric constant (Dk) and low loss (Df) even in high-frequency regions (e.g. in the GHz range). Because of such benefits, liquid crystal polymers are expected to replace polyimide as a preferred substrate material and interlayer insulation material in flexible and rigid-flexible boards.

These liquid crystal polymers, which provide high resistance to heat and superb electrical properties, can be used to produce the thermoplastic reinforcement material 30, i.e. the liquid crystal polymer non-woven fabric, which can be used as a reinforcement material in a substrate.

A method of producing the liquid crystal polymer non-woven fabric 30 will be described below in further detail, with reference to FIG. 2. The liquid crystal polymer non-woven fabric 30 can be prepared using a blow molding method. The processing by blow molding can employ a device such as a co-extruder to fuse two separate resins and blow air through a die in which numerous minute holes are formed, to produce the resins as a liquid crystal polymer binder resin and a non-woven fabric. Afterwards, a secondary processing of calendering can be applied, to provide a desired thickness.

Here, one of the two resins can be selected as a resin that displays the qualities desired for the non-woven fabric. In describing this particular embodiment, this resin will be referred to as the fibers 10.

The other of the two resins can be a resin that serves as a binder, enabling the fibers 10 to maintain the form of a non-woven fabric. In describing this particular embodiment, this resin will be referred to as the thermoplastic polymer binder 20.

Thus, a thermoplastic reinforcement material 30 having air layers, i.e. pores, inside can be formed using blow molding processing, by adding the fibers 10 and the thermoplastic polymer binder 20 through the respective extruders and having the thermoplastic polymer binder 20 secure the fibers 10. Here, a specific example of the thermoplastic polymer binder 20 can be a liquid crystal polymer binder.

In this embodiment, air layers, i.e. pores, of a certain volume can be formed within the liquid crystal polymer non-woven fabric 30 formed by the primary molding from the co-extruder described above, instead of completely compressing the liquid crystal polymer non-woven fabric 30 by calendering. In this way, the degree to which the liquid crystal polymer resin 42 may be impregnated into the liquid crystal polymer non-woven fabric 30 can be improved.

As the liquid crystal polymer non-woven fabric 30 is impregnated with the liquid crystal polymer resin 42, the liquid crystal polymer resin 42 can be absorbed by the pores of the liquid crystal polymer non-woven fabric 30, and thus be more readily impregnated into the crystal polymer non-woven fabric 30.

Figure 3:
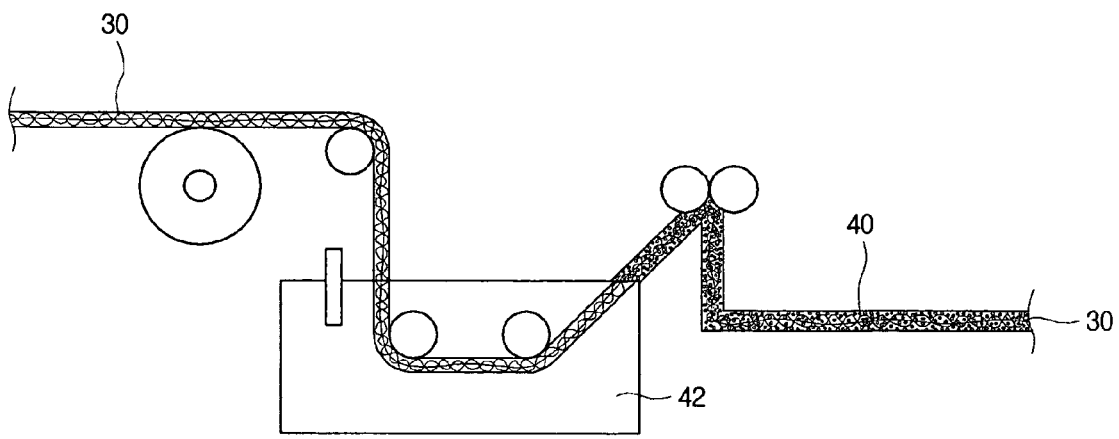

Next, as illustrated in FIG. 3, a thermoplastic resin layer 40 can be formed such that the thermoplastic reinforcement material 30 is impregnated by the thermoplastic resin 42 (S20).

Regarding the materials generally used in preparing a conventional board, the density of a glass fiber fabric may be of a value between 0.6 and 1.3 $g/cm^3$, and the density of a glass fiber non-woven fabric may be between 0.4 and 0.8 $g/cm^3$. With this particular embodiment, however, the liquid crystal polymer non-woven fabric 30 can be formed with a density of 0.1 $g/cm^3$ or lower.

When a reinforcement material used in the related art is impregnated with a liquid crystal polymer resin 42, the properties of the resin may make it difficult to obtain a sufficient melt viscosity, so that the amount of resin impregnated into the reinforcement material and the processing speed may be limited. Conversely, in this embodiment, certain layers of air can be formed in the reinforcement material, so that the reinforcement material may readily be impregnated with the liquid crystal polymer resin 42.

When a reinforcement material used in the related art is impregnated with a liquid crystal polymer resin 42 to manufacture an insulating sheet, the molecular weight of the liquid crystal polymer resin 42 may need to be increased, in order to obtain a certain level of melt viscosity. However, for a liquid crystal polymer resin 42 having a large molecular weight, it may be difficult to increase the proportion that can be dissolved in a solvent.

On the other hand, if the liquid crystal polymer resin 42 has a small molecular weight, the melt viscosity may be low, and there may be a limit to the thickness of the resin impregnated into the reinforcement material. To resolve this problem, in this embodiment, the density of the liquid crystal polymer non-woven fabric 30 can be decreased to 0.1 $g/cm^3$ or lower, as described above, to include pores, i.e. layers of air, in the inner layers. In this way, a sufficient amount of the liquid crystal polymer resin 42 can be adsorbed.

The type of liquid crystal polymer resin 42 used in this particular embodiment may be described as follows. First, the non-woven fabric component can include a thermoplastic liquid crystal polymer that has a low coefficient of thermal expansion and a fusion point of 300° C. or higher.

Next, the component that serves as a binder for the non-woven fabric can include a thermoplastic liquid crystal polymer that has a fusion point lower than that of the thermoplastic liquid crystal polymer resin described above but higher than or equal to 300° C.

Lastly, a soluble liquid crystal polymer may be used, which can be dissolved in a solvent to produce a varnish and form an insulation layer.

The types and proportions of the liquid crystal polymers described above can be used in different combinations to produce various forms of non-woven fabric that display various properties, for use in a printed circuit board. As an alternative to using thermoplastic liquid crystal polymers, it is also possible to use PPS (polyphenylene sulfide), PEEK (polyetheretherketone), etc., as these may remain unchanged at temperatures for mounting components used in a printed circuit board, of 240 to 260° C. That is, these materials have fusion points and glass transition temperatures of 280° C. or higher.

Instead of the liquid crystal polymer binder described above, it is also possible to use a thermosetting resin for the binder resin, which can be compressed onto a B-stage non-woven fabric, heated, and cured for usage.

The liquid crystal polymer non-woven fabric 30 manufactured as described above can have the molten liquid crystal polymer resin 42 impregnated into the pores formed inside, and then can be dried by hot pressing, as represented in FIG. 4, to manufacture an insulating sheet or a prepreg, as illustrated in FIG. 5. Here, a detachable film (not shown) can be applied to the surfaces of the insulating sheet and a second round of hot pressing can be applied, to manufacture the insulating sheet to a desired thickness.

Next, as illustrated in FIG. 6, metal layers 50 can be formed over the thermoplastic resin layer 40 (S30), and the thermoplastic reinforcement material 30 and thermoplastic resin layer 40 can be hot pressed (S40) at a temperature that is higher than the fusion point of the thermoplastic resin layer by 10 to 50° C. and lower than the fusion point of the thermoplastic reinforcement material by 10° C. (S42).

In this way, a copper clad laminate having metal layers 50 formed on the surfaces can be manufactured, as illustrated in FIG. 7. Furthermore, by etching the metal layers 50 formed on the surfaces to implement circuit patterns 60, a printed circuit board can be manufactured (S50), as illustrated in FIG. 8.

When manufacturing a multi-layer printed circuit board using insulating sheets and a copper clad laminate manufactured according to this embodiment, the amount of liquid crystal polymer resin 42 with which the air layers of the liquid crystal polymer non-woven fabric 30 are impregnated can be adjusted, as well as the rate at which the impregnation progresses.

Thus, in certain layers of the printed circuit board completed after the second hot pressing, a porous structure can be implemented, in which the air layers within the liquid crystal polymer non-woven fabric 30 are not completely filled in, and in which the resin 42 of liquid crystal polymers impregnated into the mesh of fibers form a coating within the pores.

In this way, the thermoplastic resin layer 40 may be obtained, as the layers of air inside the thermoplastic reinforcement material 30 are impregnated with the thermoplastic resin 42, and the sides of the thermoplastic reinforcement material 30 are coated with the thermoplastic resin 42.

Here, the thickness ratio between the thermoplastic reinforcement material 30 and the thermoplastic resin layer 40 (i.e. the thickness of the thermoplastic reinforcement material÷the thickness of the thermoplastic resin layer) can be 0.9 or higher. That is, as the thickness of the thermoplastic reinforcement material 30 impregnated with the thermoplastic resin 42 can be made to occupy a large proportion of the thickness of the total thermoplastic resin layer 40, the amount of impregnated thermoplastic resin 42 can be increased.

Moreover, as the density of the thermoplastic reinforcement material 30 can be 0.1 g/cm$^3$ or lower, so that a greater volume of air can be provided inside, the amount of impregnated thermoplastic resin 42 can be increased.

The air layers inside a printed circuit board thus manufactured may provide a dramatically improved dielectric constant (Dk). In addition, the internal stresses caused by different coefficients of thermal expansion can be dispersed through the porous portions.

Since the coefficient of thermal expansion of the liquid crystal polymer non-woven fabric 30 can be made 10 ppm/° C. or lower, the occurrence of defects caused by differences in the CTE's of the insulating sheet, the copper clad laminate, and the chip mounted on the printed circuit board may be avoided.

According to certain embodiments of the invention as set forth above, pores can be formed inside when preparing a liquid crystal polymer non-woven fabric, to dramatically improve the amount of impregnation by a liquid crystal polymer resin. The liquid crystal polymer insulating sheet and copper clad laminate can provide uniform thickness, superb surface characteristics, and low rate of moisture absorption, as well as superb electrical properties, including a low dielectric constant (Dk) and low dielectric loss (Df).

Furthermore, a multi-layer printed circuit board for use in a package manufactured using the liquid crystal polymer insulating sheets and copper clad laminate may provide thermal stability and a low coefficient of thermal expansion, to reduce bending and warpage in the board and reduce cracking and delamination in the material connecting the flip chip and the printed circuit board by reducing stresses in the connecting material.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

What is claimed is:

1. A printed circuit board comprising:
    a thermoplastic reinforcement material comprising fibers secured by a thermoplastic polymer binder and having pores formed therein;
    a thermoplastic resin layer having the thermoplastic reinforcement material impregnated with a thermoplastic resin; and
    a circuit pattern formed over the thermoplastic resin layer,
    wherein the thermoplastic reinforcement material and the thermoplastic resin layer have a thickness ratio (thickness of the thermoplastic reinforcement material÷thickness of the thermoplastic resin layer) of 0.9 or higher, and
    wherein the thermoplastic reinforcement material has a density of 0.1 g/cm$^3$ or lower.

2. The printed circuit board of claim 1, wherein the thermoplastic reinforcement material comprises a liquid crystal polymer non-woven fabric.

3. The printed circuit board of claim 1, wherein the thermoplastic resin layer comprises a liquid crystal polymer resin.

4. The printed circuit board of claim 1, wherein the thermoplastic reinforcement material has a coefficient of thermal expansion of 10 ppm/° C. or lower.

* * * * *